United States Patent
Lin (10) Patent No.: US 11,058,012 B2
(45) Date of Patent: Jul. 6, 2021

(54) CIRCUIT BOARD STRUCTURE AND MANUFACTURING METHOD THEREOF

(71) Applicant: Unimicron Technology Corp., Taoyuan (TW)

(72) Inventor: Chien-Chen Lin, Taoyuan (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/544,936

(22) Filed: Aug. 20, 2019

(65) Prior Publication Data

US 2021/0014975 A1 Jan. 14, 2021

(30) Foreign Application Priority Data

Jul. 11, 2019 (TW) .................................. 108124560

(51) Int. Cl.
| H05K 1/18 | (2006.01) |
| H05K 1/11 | (2006.01) |
| H05K 3/32 | (2006.01) |
| H05K 3/46 | (2006.01) |

(52) U.S. Cl.
CPC .............. *H05K 3/32* (2013.01); *H05K 1/185* (2013.01); *H05K 3/4682* (2013.01); *H05K 1/11* (2013.01); *H05K 1/18* (2013.01); *H05K 2203/0156* (2013.01); *H05K 2203/1469* (2013.01); *H05K 2203/167* (2013.01)

(58) Field of Classification Search
CPC ........ H05K 3/32; H05K 3/4682; H05K 1/185; H05K 2203/167; H05K 2203/0156; H05K 2203/1469

See application file for complete search history.

(56) References Cited

U.S. PATENT DOCUMENTS

| 2005/0146004 A1* | 7/2005 | Seto ........................ G01P 15/18 257/678 |
| 2009/0199399 A1* | 8/2009 | Kariya .................... H05K 1/187 29/832 |
| 2011/0084382 A1* | 4/2011 | Chen ...................... H01L 23/544 257/737 |
| 2014/0048949 A1* | 2/2014 | Lin ......................... H01L 21/50 257/774 |
| 2016/0234941 A1* | 8/2016 | Choi .................... H01L 23/5389 |

FOREIGN PATENT DOCUMENTS

| KR | 2005116760 A | * 12/2005 |
| TW | 200935992 A | 8/2009 |
| TW | 201114009 A | 4/2011 |
| TW | I517312 B | 1/2016 |

* cited by examiner

*Primary Examiner* — Ishwarbhai B Patel
(74) *Attorney, Agent, or Firm* — CKC & Partners Co., LLC (57) ABSTRACT

A circuit board structure includes a circuit layer structure, an electronic component, and a stopper. The circuit layer structure includes a plurality of dielectric layers and circuits in the dielectric layers. The electronic component is disposed in the circuit layer structure; the electronic component includes a chip and a conductive bump; the chip has a first surface and a second surface that are oppositely disposed, and the first surface of the chip contacts one of the dielectric layers; the conductive bump is on the second surface of the chip and is electrically connected to the chip. The stopper is within the circuit layer structure and abuts against the conductive bump. A method for fabricating a circuit board structure is also provided herein.

5 Claims, 14 Drawing Sheets

CIRCUIT BOARD STRUCTURE AND MANUFACTURING METHOD THEREOF

CROSS-REFERENCE TO RELATED APPLICATION

This application claims priority to Taiwan Application Serial Number 108124560, filed Jul. 11, 2019, which is herein incorporated by reference in its entirety.

BACKGROUND

Field of Invention

The present disclosure relates to a circuit board structure having an electronic component, particularly a circuit board structure having an embedded electronic component.

Description of Related Art

In the conventional manufacturing technology relates to circuit boards having embedded electronic components, when the electronic components are mounted on the substrate, the mounting accuracy of the electronic components is affected by the mounting device, and each of the electronic components has a random offset.

Figure 1A:
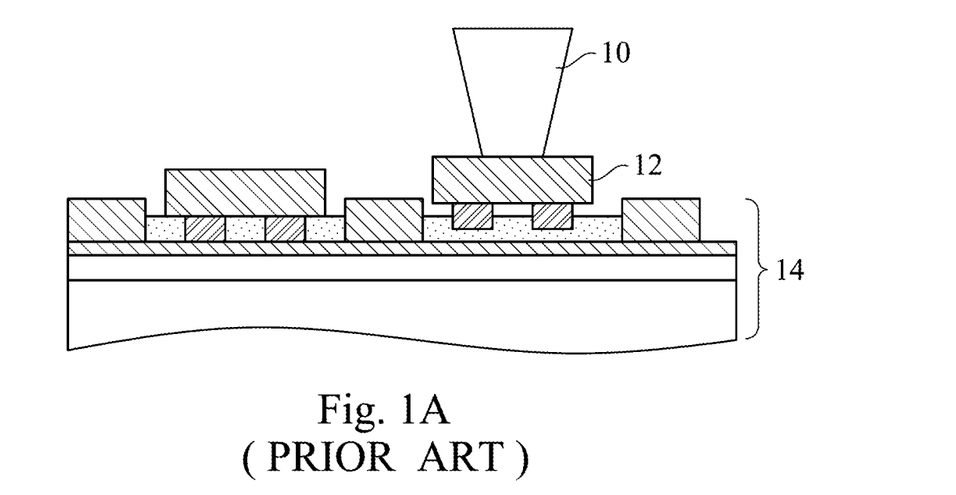
FIG. 1A is a cross-sectional view illustrating a conventional circuit board structure.
Figure 1B:
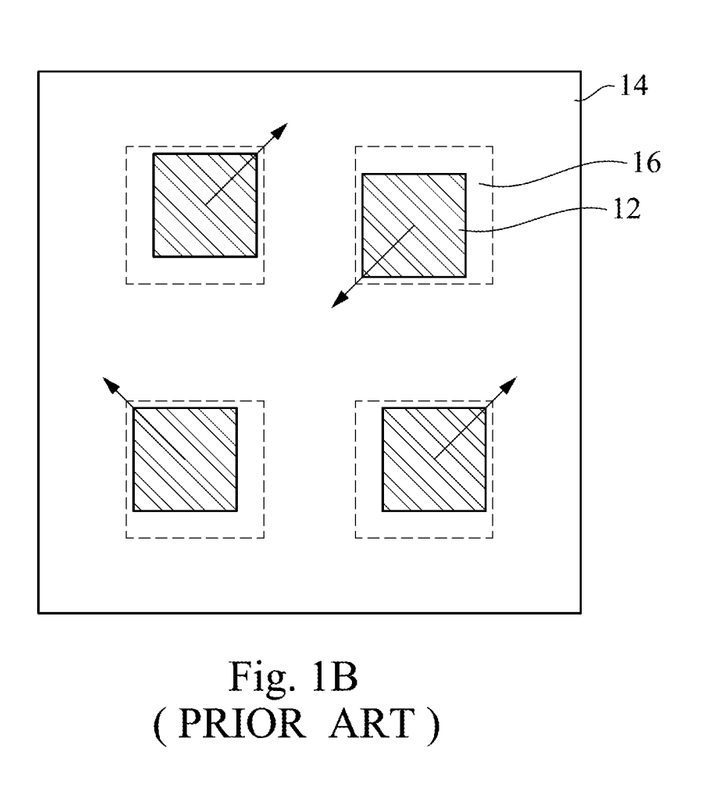
FIG. 1B is a top view illustrating a conventional circuit board structure.

Referring to FIGS. 1A and 1B, which are respectively a cross-sectional view and a top view illustrating a circuit board structure made by the conventional technique. As shown in FIG. 1A, when a chip 12 is mounted on a substrate 14 by a mounting device, offset occurs. FIG. 1B shows the alignment deviation between the chip 12 and the chip placement area 16 on the substrate 14.

The electronic components offset at the predetermined positions in the carrier board, and such condition will result in inaccurate processing of the vias or the circuit layers formed by the subsequent process. Therefore, the offset mounting of electronic components is a critical issue that needs to be solved.

SUMMARY

Some embodiments of the present disclosure provide a circuit board structure comprising a circuit layer structure, an electronic component, and a stopper. The circuit layer structure includes a plurality of dielectric layers and circuits in the dielectric layers. The electronic component is disposed in the circuit layer structure; the electronic component includes a chip and a conductive bump; the chip has a first surface and a second surface that are oppositely disposed, and the first surface of the chip contacts one of the dielectric layers; the conductive bump is on the second surface of the chip. The stopper is within the circuit layer structure and abuts against the conductive bump.

In some embodiments, the stopper has a first portion and a second portion that is perpendicular to the first portion.

In some embodiments, the stopper abuts against the conductive bump in a first direction and a second direction that is perpendicular to the first direction.

In some embodiments, the circuit layer structure further includes an insulating layer and a via in the insulating layer, the insulating layer is over the second surface of the chip, and the via is electrically connected to the conductive bump.

In some embodiments, the circuit board structure further includes an adhesive layer which is positioned between the second surface of the chip and the insulating layer and adheres to the conductive bumps.

Some embodiments of the present disclosure also provide a method for manufacturing a circuit board structure; the method comprises: providing a carrier board having a release layer; forming a stopper over the carrier board; disposing an adhesive layer over the carrier board; abutting the conductive bump of an electronic component against the stopper and placing the electronic component over the carrier board; performing build-up process; and removing the carrier board.

In some embodiments, wherein the electronic component comprises a chip having a first surface and a second surface that are oppositely disposed, and the conductive bump is located on the second surface; wherein the performing the build-up process comprising: forming a plurality of dielectric layers and circuits in the dielectric layers over the first surface of the chip.

In some embodiments, the method further comprises forming an outer layer over the second surface of the chip and the conductive bump, and the outer layer comprises an insulating layer, a via, and a patterned circuit layer. The via is within the insulating layer and is electrically connected to the conductive bump. The patterned circuit layer is over the insulating layer and is electrically connected to the via.

In some embodiments, the operation of abutting the conductive bump of the electronic component against the stopper and placing the electronic component over the carrier board comprises: abutting the conductive bump against the first portion of the stopper; and abutting the conductive bump against the second portion of the stopper, wherein the second portion is perpendicular to the first portion.

In some embodiments, the operation of disposing an adhesive layer over the carrier board comprises covering the stopper with the adhesive layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the method of the present disclosure is described below as a series of operations or steps, it will be appreciated that the illustrated order of such operations or steps should not be interpreted to be limiting for the present disclosure. For example, some operations or steps may be performed in a different order and/or concurrently with other operations or steps. In addition, not all of the illustrated operations, steps, and/or characteristics are required to implement the embodiments of the present disclosure. Further, each of the operations or steps depicted herein may include several sub-steps or actions.

Some embodiments of the present disclosure provide a circuit board structure and a manufacturing method thereof; the circuit board structure can be applied to, but not limited to, a package carrier board, or a printed circuit board.

Figure 2:
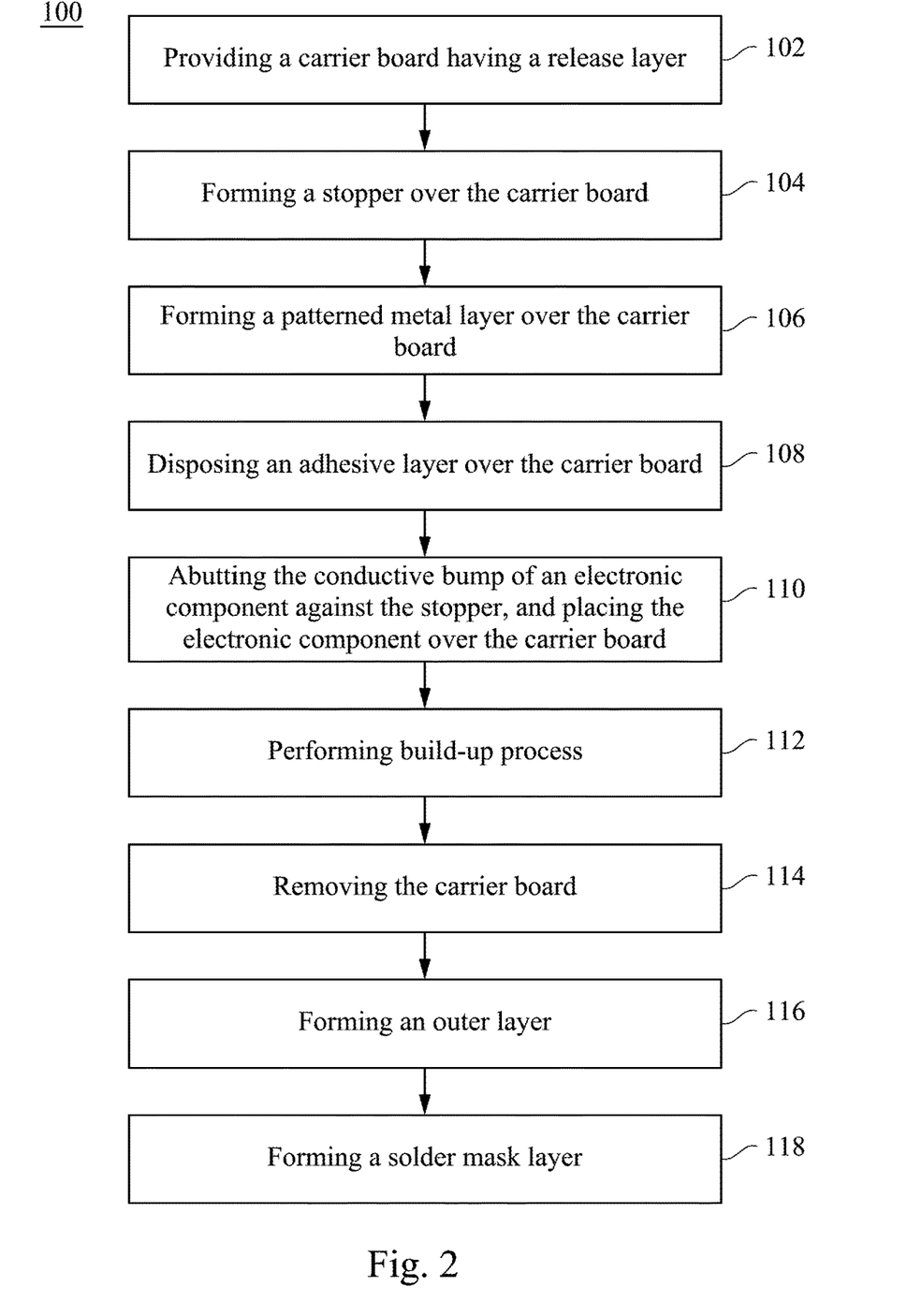
FIG. 2 shows a flow chart of a method of fabricating a circuit board structure in accordance with embodiments of the present disclosure.

FIG. 2 shows a flow chart of a method 100 for fabricating a circuit board structure, including operations 102 through 118, in accordance with some embodiments of the present disclosure. It is noted that the method 100 is merely exemplary and is not intended to limit the disclosure. FIGS. 3A through 11 are schematic views illustrating the circuit board structure at one of the various manufacturing stages, respectively.

Figure 3A:
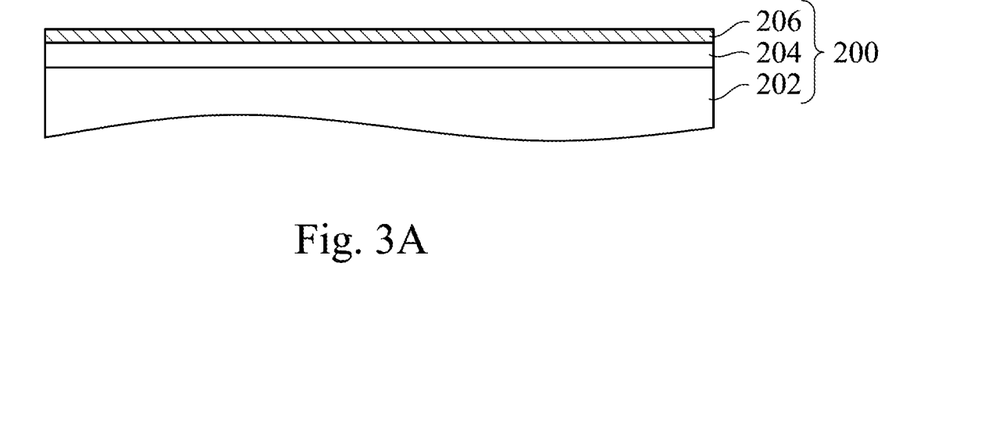
FIG. 3A is a cross-sectional view illustrating a circuit board structure at one of the manufacturing stages in accordance with embodiments of the present disclosure.
Figure 3B:
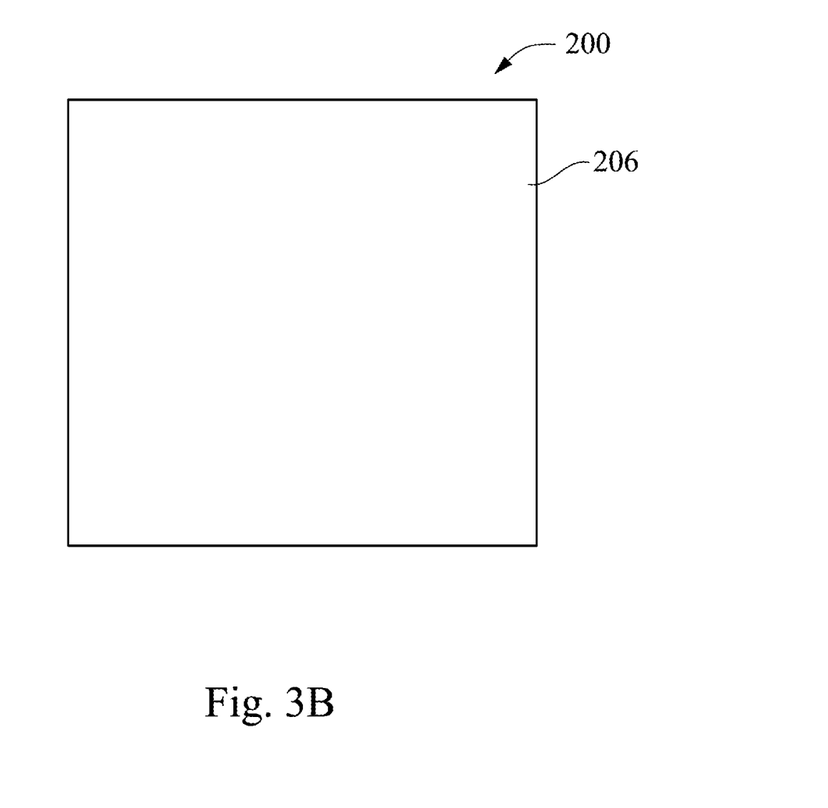
FIG. 3B is a top view illustrating a circuit board structure at one of the manufacturing stages in accordance with embodiments of the present disclosure.

Referring to FIGS. 2, 3A, and 3B, in operation 102 of the method 100, the carrier board having a release layer is provided. FIG. 3A is a cross-sectional view of the carrier board 200, and FIG. 3B is a top view of the carrier board 200. The carrier board 200 includes a support layer 202, a release layer 204 over the support layer 202, and a metal layer 206 over the release layer 204. The release layer 204 is configured to facilitate separation of the carrier board 200 from the precursor structure formed thereon in a later step, which will be described in more detail below.

The support layer 202 may be made of organic polymeric material such as epoxy, polyimide (PI), polyethylene terephthalate (PET), and/or bismaleimide triazine (BT), or the like. The release layer 204 may be formed, for example, by treating a plastic film with plasma or coating with fluorine, or by coating a silicone release agent on the surface of a thin membranous material such as polyethylene terephthalate (PET), polyethylene (PE) or oriented polypropylene (OPP). The material of the metal layer 206 may be, for example, copper, aluminum, or other suitable electrically conductive material.

Figure 4A:
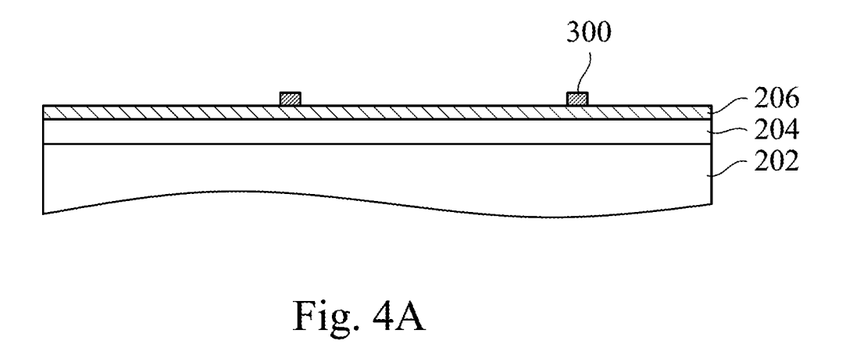
FIG. 4A is a cross-sectional view illustrating a circuit board structure at one of the manufacturing stages in accordance with embodiments of the present disclosure.
Figure 4B:
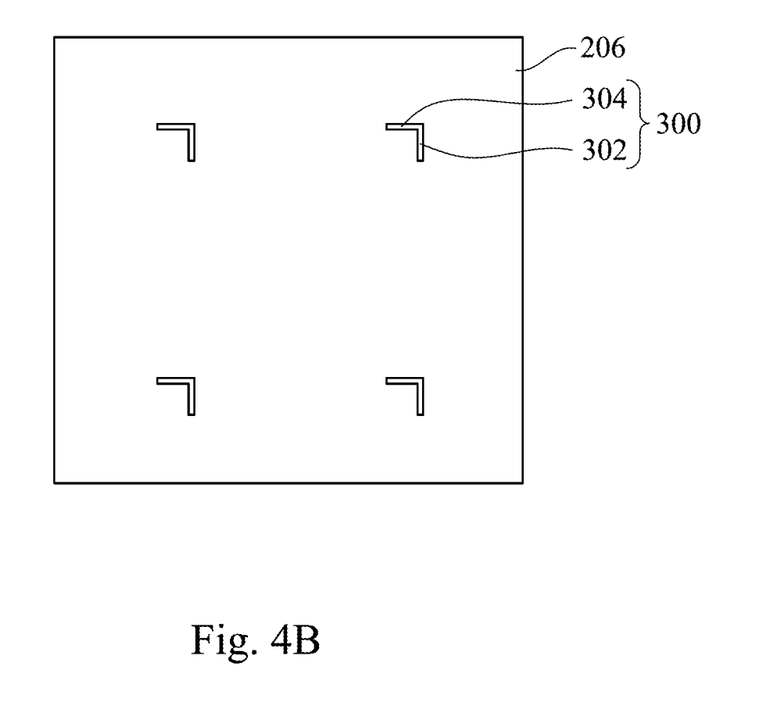
FIG. 4B is a top view illustrating a circuit board structure at one of the manufacturing stages in accordance with embodiments of the present disclosure.

Referring to FIGS. 2, 4A, 4B, in operation 104 of the method 100, a stopper is formed over the carrier board. FIG. 4A illustrates a stopper 300 is formed over the metal layer 206. FIG. 4B is a top view illustrating the stopper 300 containing a first portion 302 and a second portion 304 that is perpendicular to the first portion 302. In other words, the stopper 300 has a right-angle shape structure. In other embodiments, the first portion and the second portion may be spaced apart; in other words, the first portion and the second portion are not joined together.

The material of the stopper 300 may be metal, plastic material, resin, or the like. For example, the material of the stopper 300 is prepreg, Ajinomoto Build-up Film (ABF), photoimageable dielectric (PID), phenolic resin, epoxy resin, polyamide resin, polytetrafluoroethylene (Teflon), or the like. The stopper 300 may be formed by using, for example, electroplating, electroless plating, sputtering, coating, printing, etc., or maybe in combination with lithography.

Figure 5A:
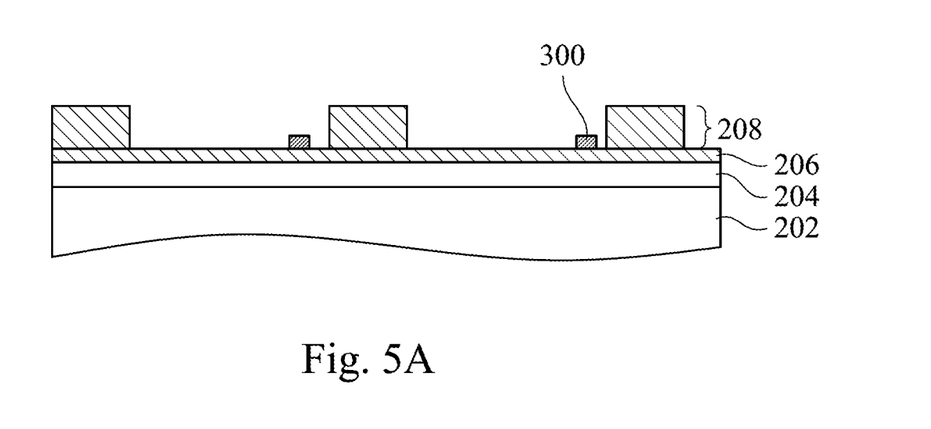
FIG. 5A is a cross-sectional view illustrating a circuit board structure at one of the manufacturing stages in accordance with embodiments of the present disclosure.
Figure 5B:
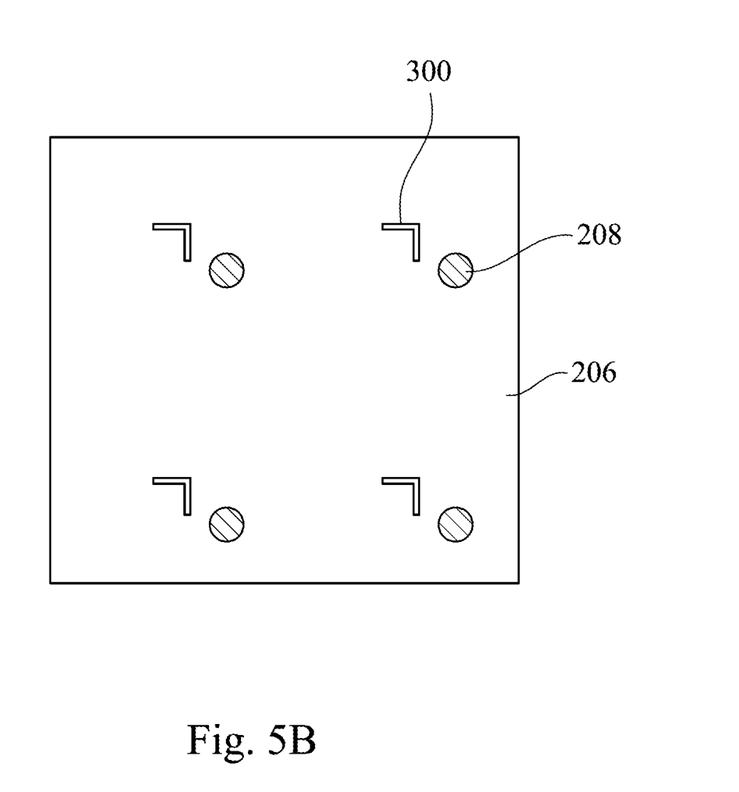
FIG. 5B is a top view illustrating a circuit board structure at one of the manufacturing stages in accordance with embodiments of the present disclosure.

Please refer to FIGS. 2, 5A, and 5B. In operation 106 of method 100, a patterned metal layer is formed over the carrier board. FIG. 5A illustrates a patterned metal layer 208 is formed over the metal layer 206. FIG. 5B is a top view illustrating the patterned metal layer 208 distributed over the surface of the metal layer 206. The patterned metal layer 208 may include conductive plugs and conductive circuits.

Formation of the patterned metal layer 208 may be performed by the following steps; firstly, a photoresist layer such as a dry film (not shown) is formed on the metal layer 206; then, the photoresist layer is patterned to expose portions of the metal layer 206 through lithography process. Thereafter, processes such as electroplating and a removal process for the photoresist layer are performed to form the patterned metal layer 208.

Figure 6A:
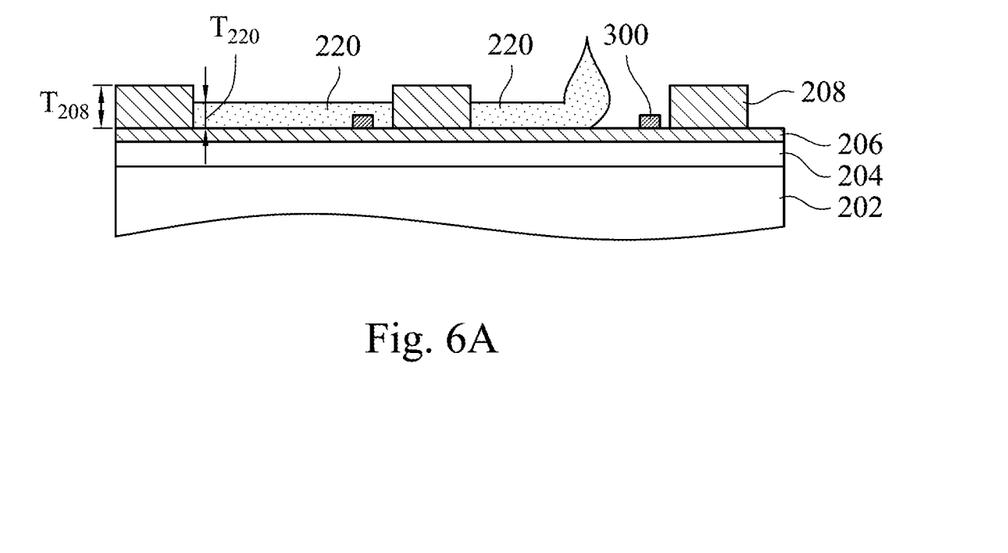
FIG. 6A is a cross-sectional view illustrating a circuit board structure at one of the manufacturing stages in accordance with embodiments of the present disclosure.
Figure 6B:
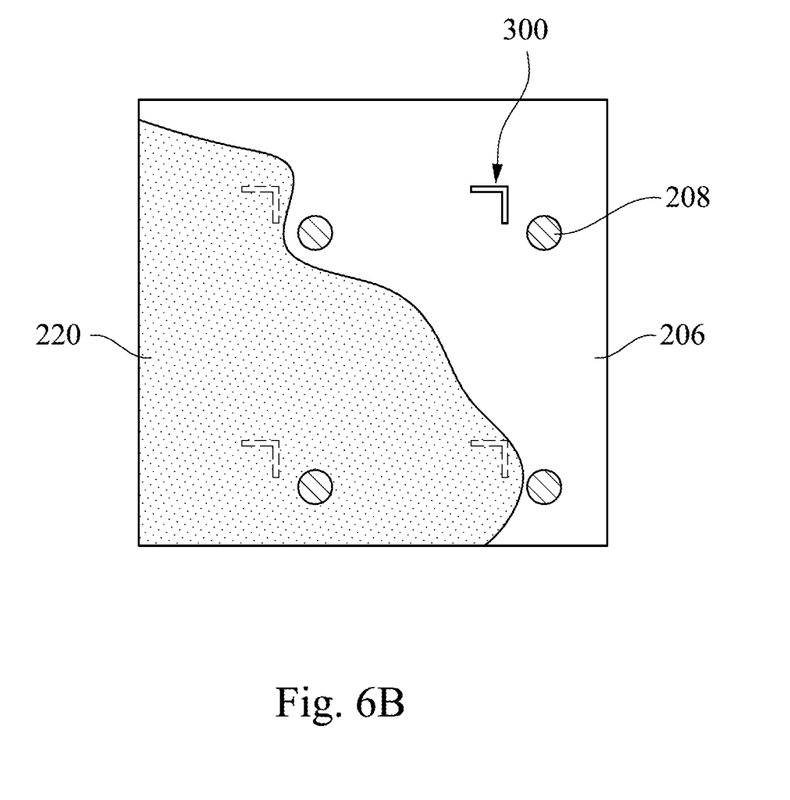
FIG. 6B is a top view illustrating a circuit board structure at one of the manufacturing stages in accordance with embodiments of the present disclosure.

Please refer to FIGS. 2, 6A, and 6B. In operation 108 of the method 100, an adhesive layer is disposed over the carrier board. FIGS. 6A and 6B illustrate an adhesive layer 220 is disposed over the metal layer 206. The adhesive layer 220 may be disposed through lamination, printing, coating, or the like. The material of the adhesive layer 220 may comprise, for example, resin or other suitable material. In some embodiments, the material of the adhesive layer 220 may be a thermal curing adhesive.

The adhesive layer 220 is configured to adhere and secure the conductive bumps of the electronic component in the subsequent processes. As shown in FIGS. 6A and 6B, in some embodiments, the adhesive layer 220 covers the stopper 300. In some embodiments, the thickness $T_{220}$ of the adhesive layer 220 is smaller than the thickness $T_{208}$ of the patterned metal layer 208. In some embodiments, the thickness $T_{220}$ of the adhesive layer 220 is not greater than the height of the conductive bumps of the electronic component to be mounted later.

Please refer to FIGS. 2, and 7A through 7H. In operation 110 of the method 100, the conductive bump of the electronic component is disposed to abut against the stopper and the electronic component is placed over the carrier board. FIGS. 7A, 7C, 7E, and 7G illustrate an exemplary process for placing an electronic component. FIGS. 7B, 7D, 7F, and 7H are corresponding partial enlarged views, respectively. The electronic component 310 includes a chip 320 and a conductive bump 330. The chip 320 has a first surface 322 and a second surface 324 that are oppositely disposed, and the conductive bump 330 is located on the second surface 324 of the chip 320. The mounting device 20 can absorb the first surface 322 of the chip 320 using, for example, vacuum suction, to make the conductive bump 330 facing the surface of the metal layer 206 of the carrier board 200.

Figure 7A:
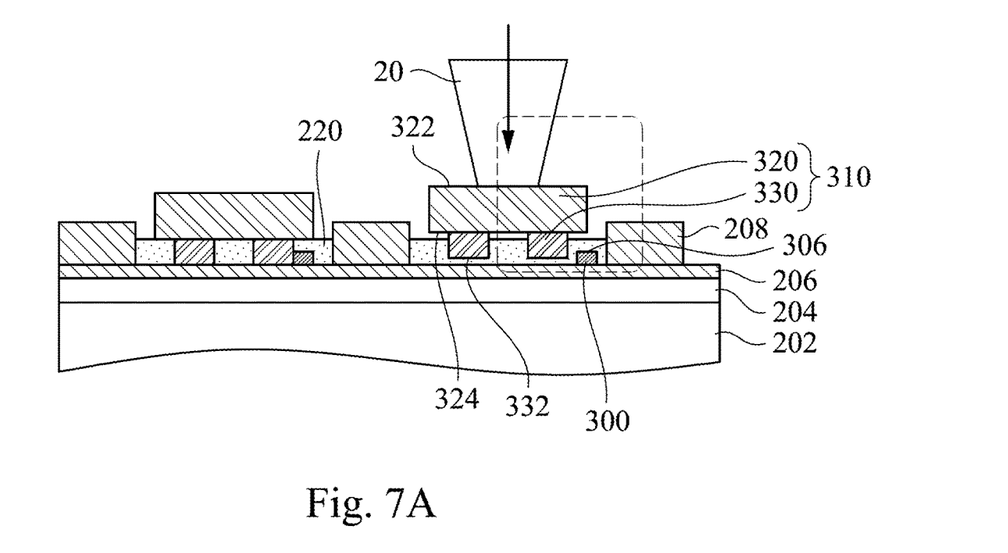
FIG. 7A is a cross-sectional view illustrating a circuit board structure at one of the manufacturing stages in accordance with embodiments of the present disclosure.
Figure 7B:
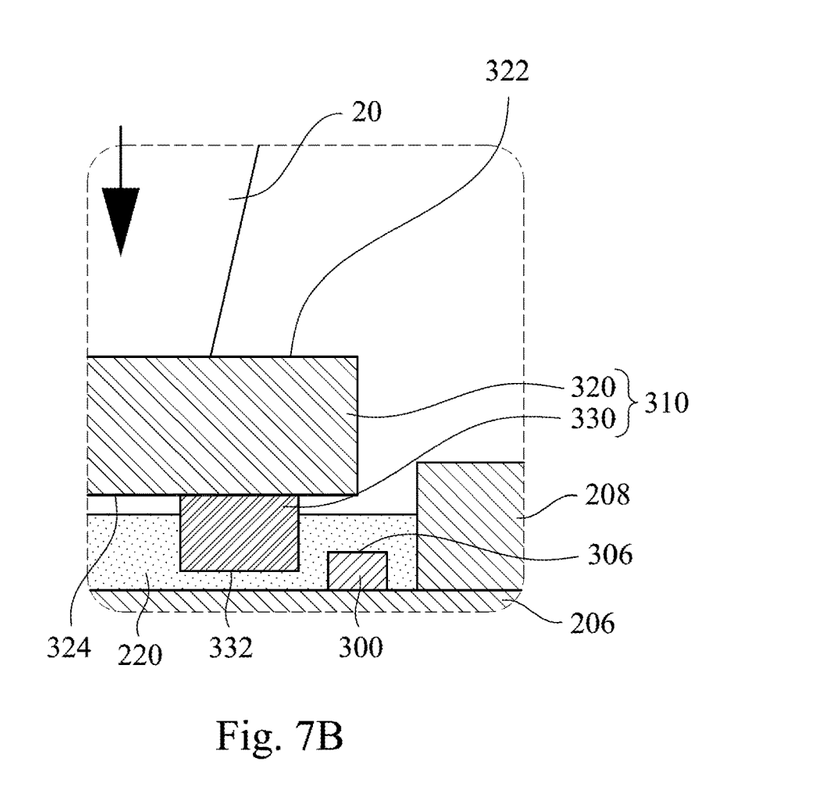
FIG. 7B is a partial enlarged view of FIG. 7A.

As shown in FIGS. 7A and 7B, firstly, the electronic component 310 is moved downward until the conductive bump 330 is located within the adhesive layer 220 and the bottom surface 332 of the conductive bump 330 is lower than the top surface 306 of the stopper 300.

Figure 7C:
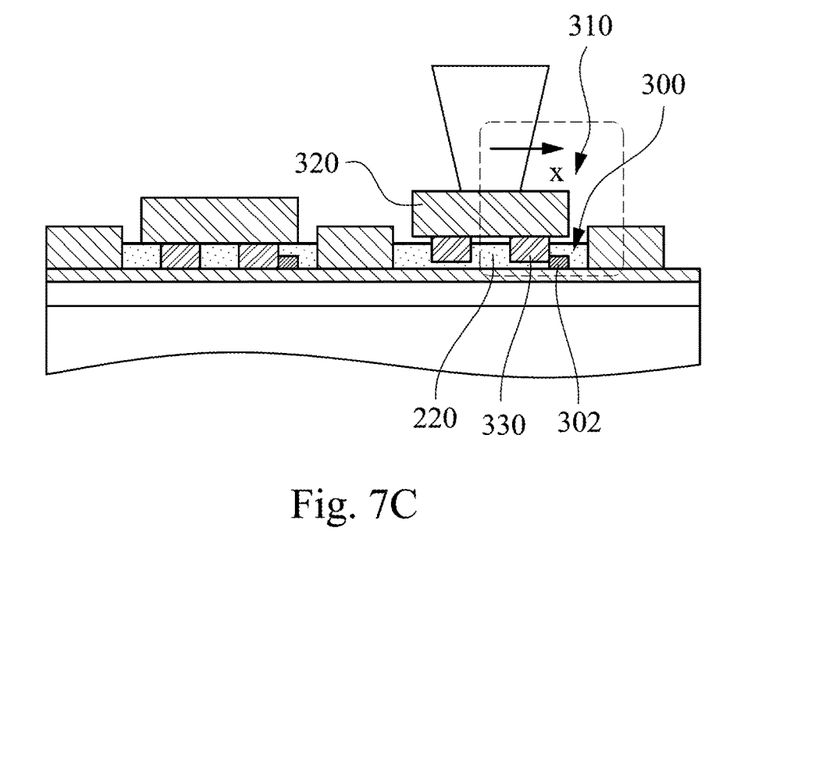
FIG. 7C is a cross-sectional view illustrating a circuit board structure at one of the manufacturing stages in accordance with embodiments of the present disclosure.
Figure 7D:
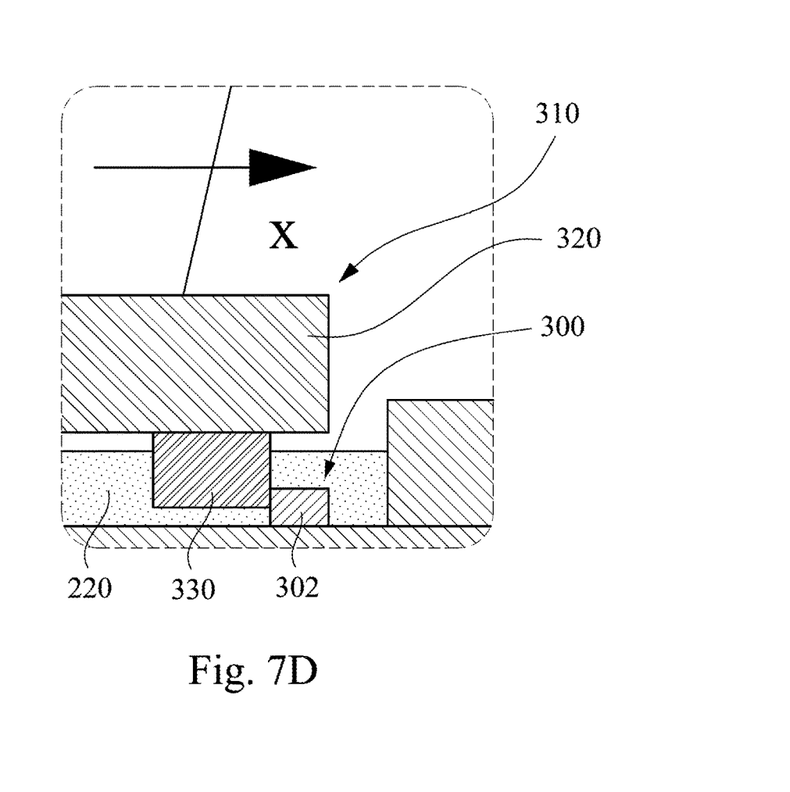
FIG. 7D is a partial enlarged view of FIG. 7C.

Next, as shown in FIGS. 7C and 7D, the electronic component 310 is moved in the first direction x until the conductive bump 330 touches the first portion 302 of the stopper 300. Therefore, the position of the conductive bump 330 in the first direction x is determined.

Figure 7E:
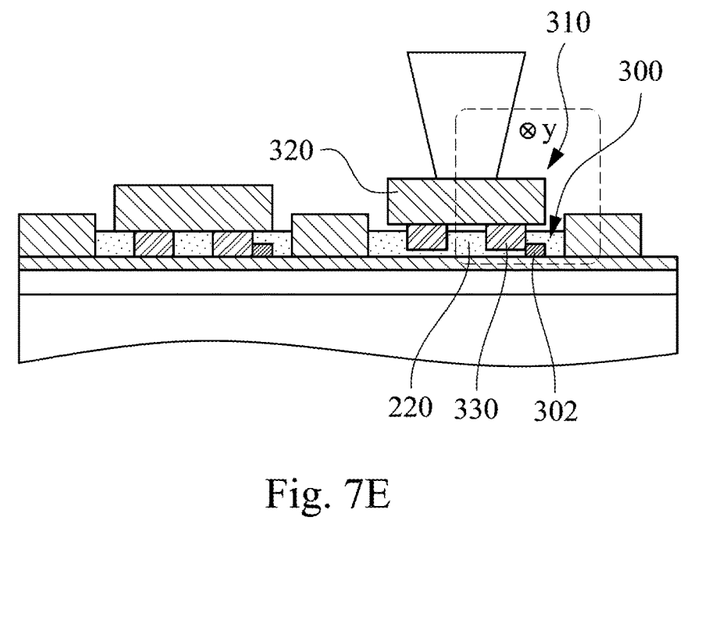
FIG. 7E is a cross-sectional view illustrating a circuit board structure at one of the manufacturing stages in accordance with embodiments of the present disclosure.
Figure 7F:
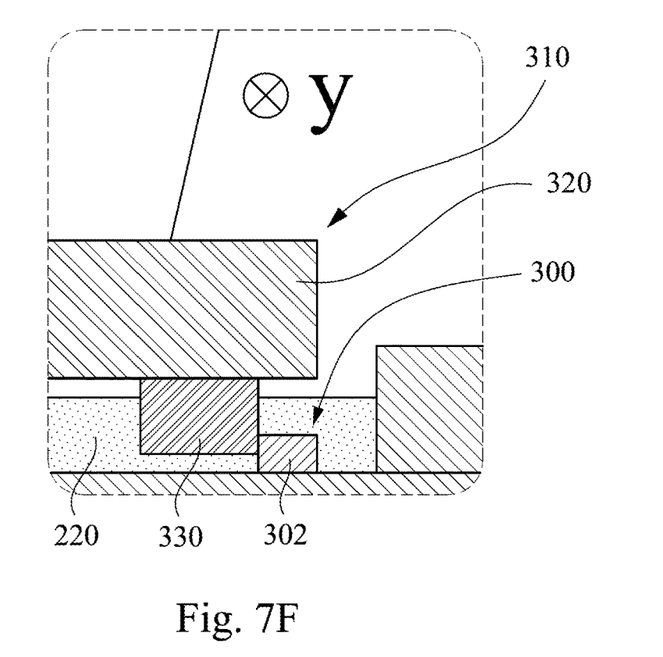
FIG. 7F is a partial enlarged view of FIG. 7E.

Next, as shown in FIGS. 7E and 7F, the electronic component 310 is moved in a second direction y perpendicular to the first direction x until the conductive bump 330 touches the second portion 304 (which is perpendicular to the first portion 302 and is not shown in this figure) of the stopper 300. Therefore, the position of the conductive bump 330 in the second direction y is determined.

Figure 7G:
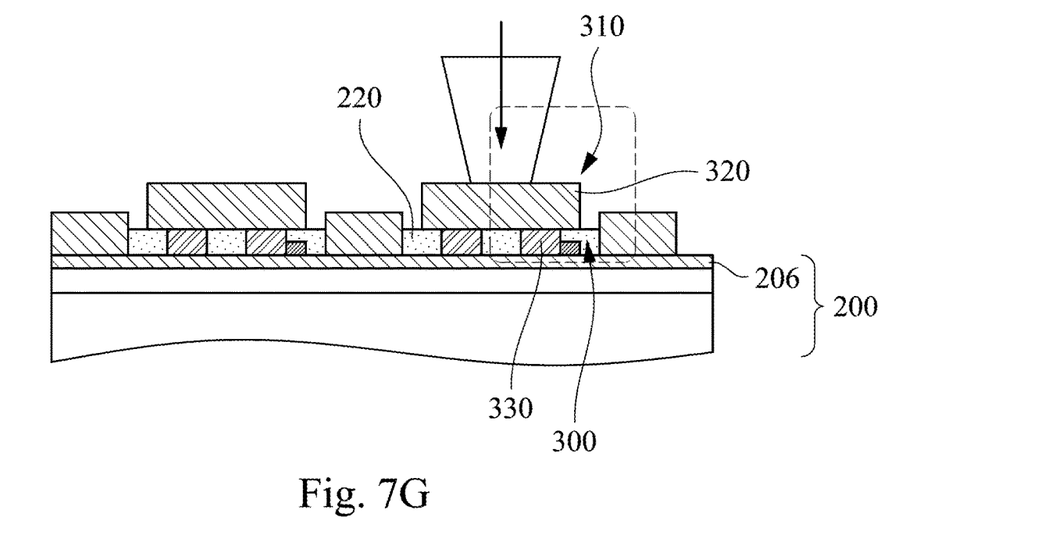
FIG. 7G is a cross-sectional view illustrating a circuit board structure at one of the manufacturing stages in accordance with embodiments of the present disclosure.
Figure 7H:
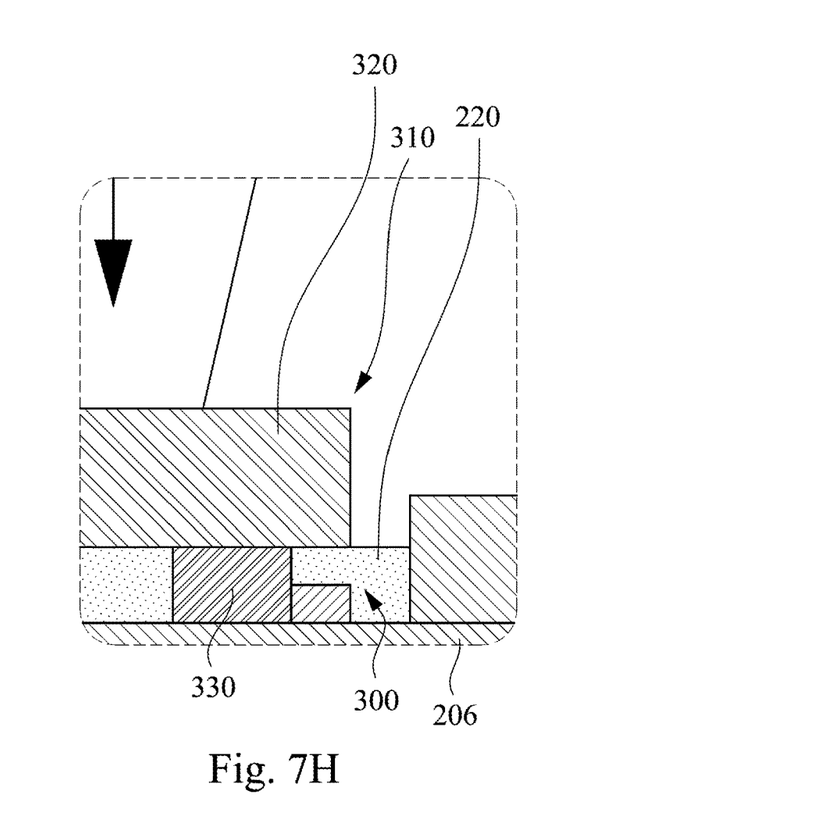
FIG. 7H is a partial enlarged view of FIG. 7G.

Next, as shown in FIGS. 7G and 7H, the electronic component 310 is moved downward again until the conductive bump 330 contacts (either directly or indirectly contacts) the metal layer 206 of the carrier board 200. In addition, the adhesive layer 220 surrounds the conductive bump 330. In other words, the adhesive layer 220 is positioned between the metal layer 206 and the chip 320 and fills the space between the plurality of conductive bumps 330.

In some embodiments, when the adhesive layer 220 is a thermal curing adhesive, the conductive bumps 330 of the electronic component 310 can be fixed by a baking process.

As shown in FIGS. 7A through 7H, when the electronic component 310 is placed, the first portion 302 of the stopper 300 abuts against the conductive bump in the first direction x, the second portion 304 of the stopper 300 abuts against the conductive bump in the second direction y (refers to FIG. 4B), and the conductive bump 330 is adhered and fixed in the adhesive layer 220. Therefore, the stopper 300 can guide the electronic component 310 to be accurately placed at a predetermined position on the carrier board 200 during the mounting process.

Figure 8:
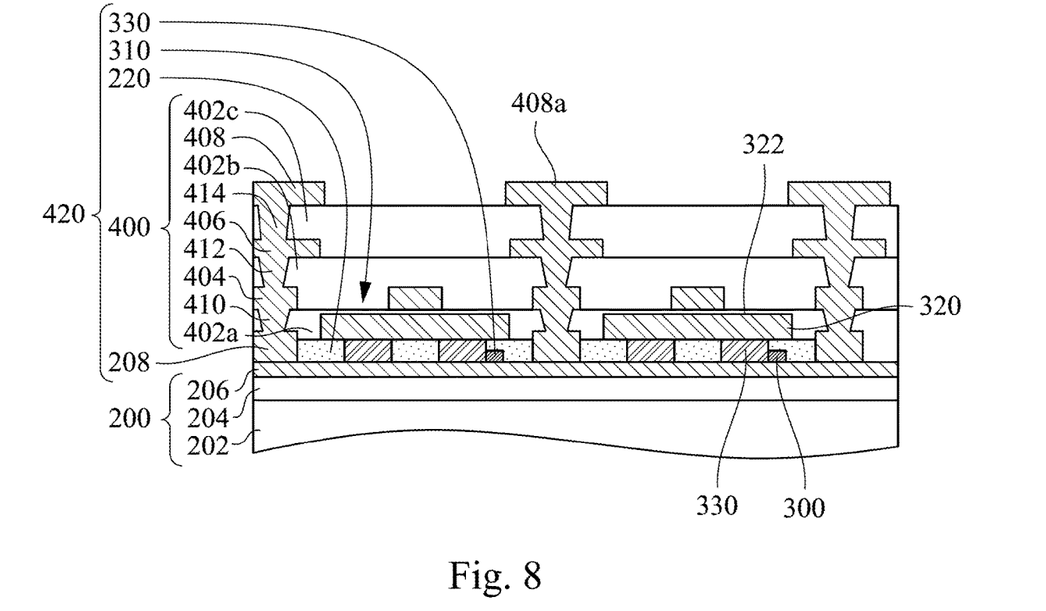
FIGS. 8 to 11 are cross-sectional views illustrating a circuit board structure respectively at one of the various manufacturing stages in accordance with embodiments of the present disclosure.

Next, referring to FIGS. 2 and 8, in operation 112 of the method 100, build-up process is performed to form a precursor structure. FIG. 8 illustrates the build-up process is performed over the first surface 322 of the chip 320. A laminar circuit structure 400 may be formed by performing build-up process and laser-drilling techniques; the laminar circuit structure 400 comprises: dielectric layers, for example, a first dielectric layer 402a, a second dielectric layer 402b, and a third dielectric layer 402c; patterned circuit layers, for example, the first patterned circuit layer 404 in the second dielectric layer 402b, the second patterned circuit layer 406 in the third dielectric layer 402c, the third patterned circuit layer 408 on the third dielectric layer 402c; and vias, for example, a plurality of first vias 410 in the first dielectric layer 402a, a plurality of second vias 412 in the second dielectric layer 402b, and a plurality of third vias 414 in the third dielectric layer 402c. In the present disclosure, the number of the circuit layers by the build-up process is not limited, and the number can be adjusted as needed.

The material of the first, second, and third dielectric layers 402a, 402b, and 402c may include prepreg, Ajinomoto Build-up Film (ABF), photosensitive dielectric (PID), resin, or the like. For example, the resin may be phenolic resin, epoxy resin, polyimide resin, or polytetrafluoroethylene. The materials of the first, second, and the third patterned circuit layers 404, 406, and 408 may be, for example, copper, aluminum, or other suitable electrically conductive material. The materials of the first, second, and third vias 410, 412, and 414 may be, for example, copper, aluminum, or other suitable electrically conductive material.

FIG. 8 illustrates a precursor structure 420 is formed over the carrier board 200; the precursor structure 420 includes the patterned metal layer 208, the adhesive layer 220, the electronic component 310, the stopper 300, and the laminar circuit structure 400.

As shown in FIG. 8, the patterned metal layer 208 is electrically connected to the circuits of the laminar circuit structure 400, for example, the first via 410, the first patterned circuit layer 404, the second via 412, the second patterned circuit layer 406, the third via 414, and the third patterned circuit layer 408. Further, a portion of the circuits of the third patterned circuit layer 408 can serve as an electrically conductive pad 408a.

Figure 9:
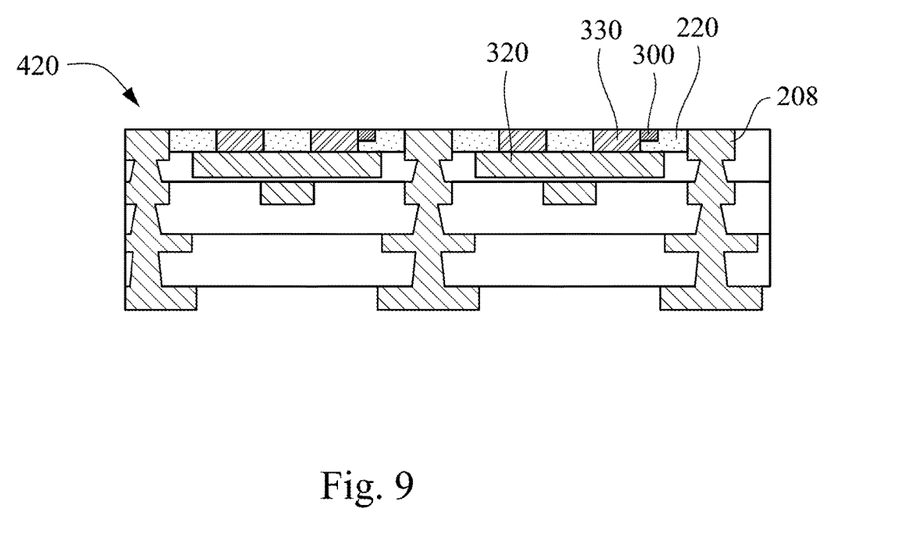

Next, referring to FIGS. 2 and 9, in operation 114 of method 100, the carrier board is removed. Since the carrier board 200 includes the release layer 204, the precursor structure 420 can be separated from the carrier board 200 by lifting off or other stripping techniques. The metal layer 206 may be also removed during or after the separation of the carrier board 200. FIG. 9 is a schematic view showing the carrier board 200 has been removed and the precursor structure 420 is turned upside down. After the carrier board 200 is removed, the patterned metal layer 208, the adhesive layer 220, the stopper 300, and the conductive bumps 330 are exposed. In addition, the upper surfaces of the patterned metal layer 208, the adhesive layer 220, the stopper 300, and the conductive bumps 330 are substantially even.

Figure 10:
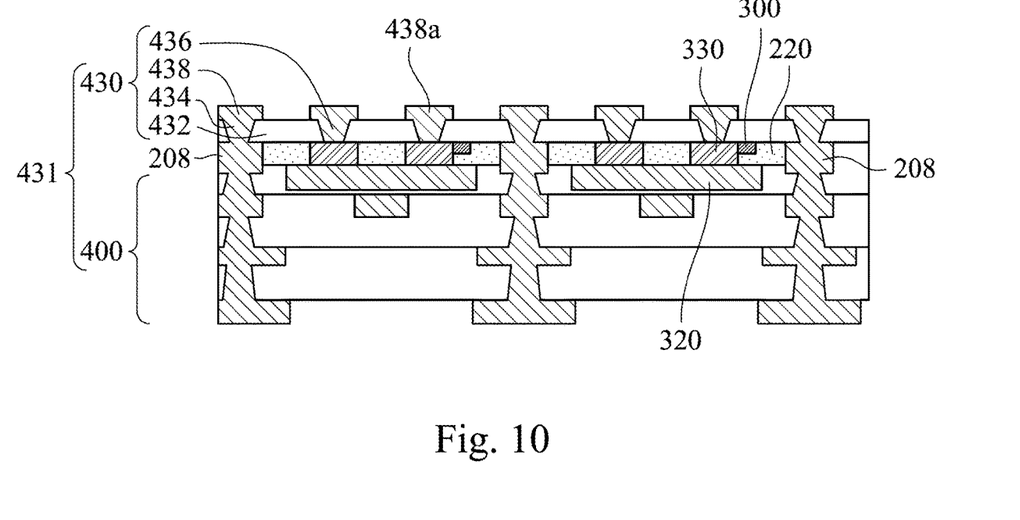

Next, referring to FIGS. 2 and 10, in operation 116 of the method 100, an outer layer is formed. First, an insulating layer 432 is formed over the patterned metal layer 208, the adhesive layer 220, the stopper 300, and the conductive bump 330. Then, a plurality of via openings can be formed in the insulating layer 432 by using, for example, laser-drilling or lithography techniques; the via openings expose portions of the surfaces of the patterned metal layer 208 and the conductive bumps 330. Thereafter, a photoresist layer (now shown) such as a dry film is formed on the insulating layer 432, and the photoresist layer is patterned to expose portions of the insulating layer 432 and the via openings by lithography process. Then, a deposition process such as electroplating and a removal process of the photoresist layer are performed to form fourth vias 434, fifth vias 436, and a fourth patterned circuit layer 438.

FIG. 10 illustrates the outer layer 430 is formed over the patterned metal layer 208, the adhesive layer 220, the stopper 300, and the conductive bump 330. The outer layer 430 includes the insulating layer 432, the forth via 434, the fifth via 436, and the fourth patterned circuit layer 438. The insulating layer 432 covers the patterned metal layer 208, the adhesive layer 220, the stopper 300, and the conductive bump 330. The fourth via 434 is within the insulating layer 432 and is electrically connected to the patterned metal layer 208. The fifth via 436 is within the insulating layer 432 and is electrically connected to the conductive bump 330. The fourth patterned circuit layer 438 is located over the insulating layer 432 and electrically connected to the fourth via 434 and the fifth via 436. Further, a portion of the circuits of the fourth patterned circuit layer 438 can serve as an electrically conductive pad 438a.

The material of the insulating layer 432 may include prepreg, Ajinomoto Build-up Film (ABF), photoimageable dielectric (PID), resin, or the like. For example, the resin may be phenolic resin, epoxy resin, polyamide resin, or polytetrafluoroethylene. The material of the fourth via 434 and the fifth via 435 may be, for example, copper, aluminum, or other suitable electrically conductive material. The material of the fourth patterned circuit layer 438 may be, for example, copper, aluminum, or other suitable electrically conductive material.

As shown in FIG. 10, the outer layer 430, the patterned metal layer 208, and the laminar circuit structure 400 can be collectively referred to as a circuit layer structure 431.

Figure 11:
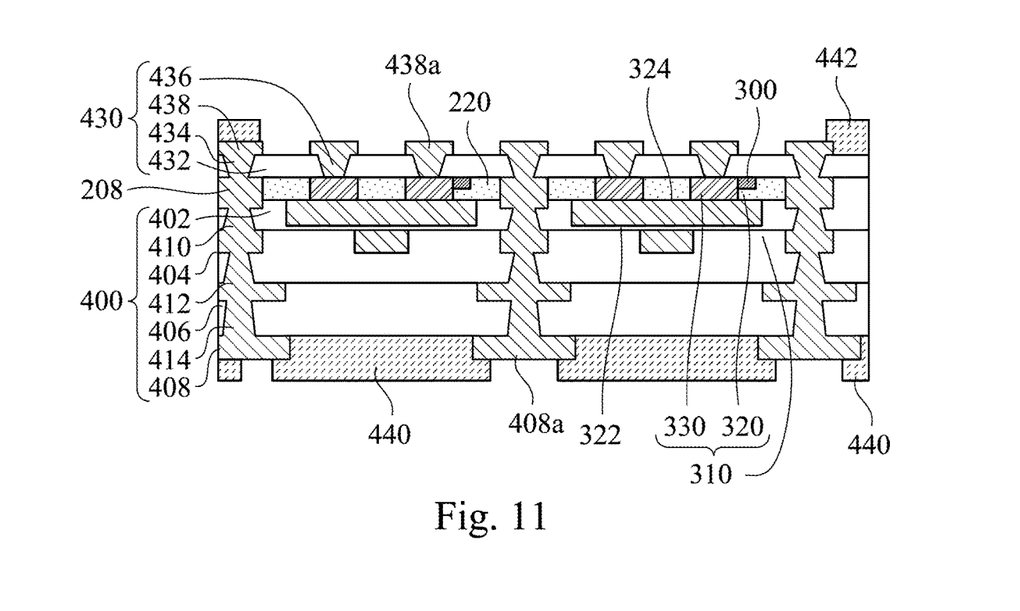

Next, please refer to FIGS. 2 and 11, in operation 118 of the method 100, a solder mask layer is formed. As shown in FIG. 11, a first solder mask layer 440 is formed on the outer side of the laminar circuit structure 400; the first solder mask layer 440 has openings exposing the electrically conductive pads 408a of the third patterned circuit layer 408. The second solder mask layer 442 is formed on the outer side of the outer layer 430; the second solder mask layer 442 has openings exposing the electrically conductive pads 438a of the fourth patterned circuit layer 438. The material of the first solder mask layer 440 and the second solder mask layer 442 may be, for example, green lacquer or other suitable material. The first solder mask layer 440 and the second solder mask layer 442 may be formed by coating, printing, or the like.

Figure 12:
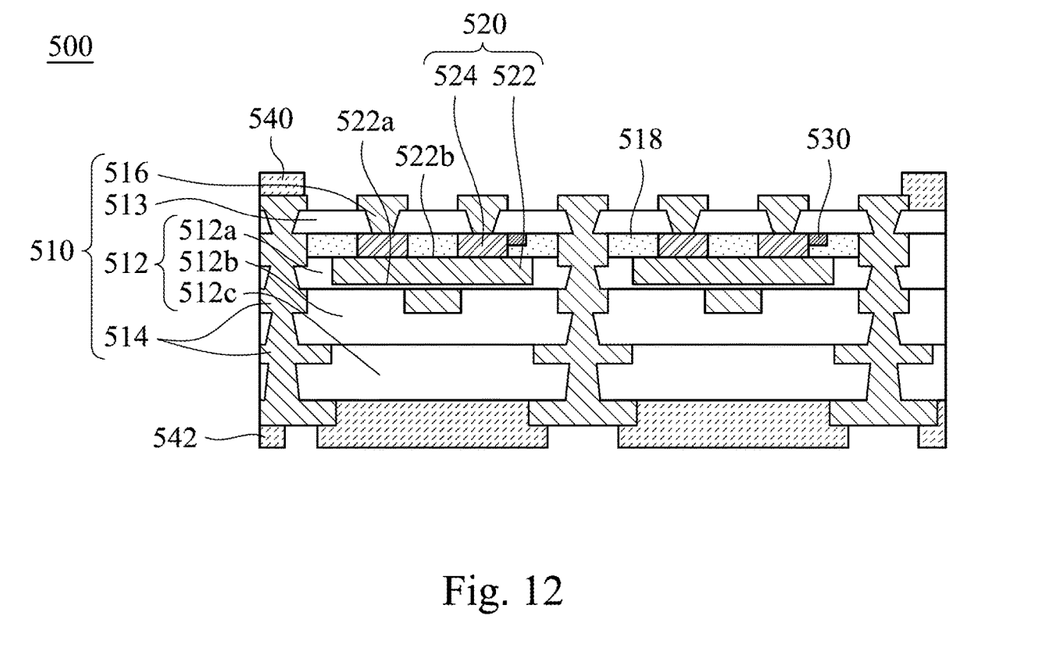
FIG. 12 is a cross-sectional view illustrating a circuit board structure in accordance with embodiments of the present disclosure.

Some embodiments of the present disclosure also provide a circuit board structure; referring to FIG. 12, the circuit board structure 500 includes a circuit layer structure 510, an electronic component 520, and a stopper 530. The circuit layer structure 510 includes a plurality of dielectric layers 512 (e.g., the first, second, and third dielectric layers 512a, 512b, and 512c) and the circuits 514 in the dielectric layers 512; the circuit layer structure 510 further comprises an insulating layer 513 located over the dielectric layers 512. The electronic component 520 is disposed in the circuit layer structure 510 and between the first dielectric layer 512a and the insulating layer 513; the electronic component 520 includes a chip 522 and a conductive bump 524, and the chip 522 has a first surface 522a and a second surface 522b that are oppositely disposed to each other; the conductive bump 524 is on the second surface 522b of the chip 522. The stopper 530 is within the circuit layer structure 510 and abuts against the conductive bump 524.

As shown in FIG. 12, the circuit layer structure 510 further includes vias 516 within the insulating layer 513 and electrically connected to the conductive bump 524.

As shown in FIG. 12, the circuit board structure 500 further includes an adhesive layer 518 which is located between the second surface 522b of the chip 522 and the first dielectric layer 512a and adheres to the conductive bump 524.

In addition, solder mask layers 540 and 542 are respectively disposed on the two opposite outer sides of the circuit layer structure 510 to protect the circuit layer structure 510.

As shown in FIG. 12, an aspect of the present disclosure provides a circuit board structure 500 for embedded electronic components, including a circuit layer structure 510, an electronic component 520, and a stopper 530. The circuit layer structure 510 includes a plurality of dielectric layers 512 and circuits 514 in the dielectric layers 512. The electronic component 520 is disposed within the circuit layer structure 510; the electronic component 520 includes a chip 522 and a conductive bump 524; the chip 522 has a first surface 522a and a second surface 522b that are oppositely disposed; the first surface 522a of the chip 522 contacts a dielectric layer 512a of the dielectric layers 512; the conductive bump 524 is located on the second surface 522b of the chip 522. The stopper 530 is within the circuit layer structure 510 and abuts against the conductive bump 524.

Figure 13:
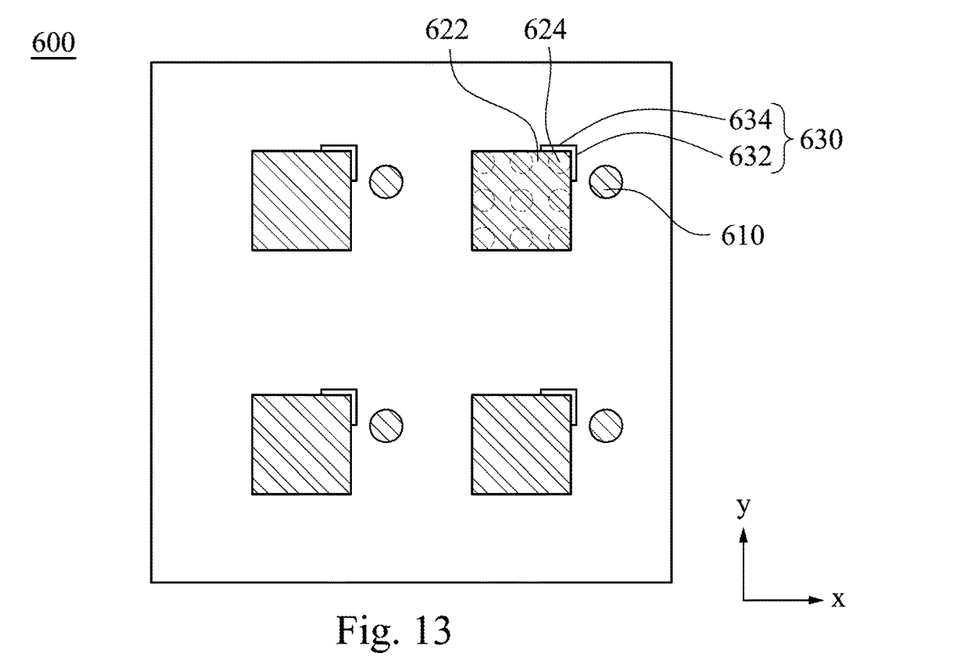
FIG. 13 is a top view illustrating a circuit board structure at one of the manufacturing stages in accordance with embodiments of the present disclosure.

FIG. 13 is a top view of a circuit board structure 600 at one of the manufacturing stages in accordance with some embodiments. FIG. 13 illustrates the relative positional relationship between the conductive bumps 624, the chip 622, and the stopper 630. In addition, a plurality of conductive plugs 610 are distributed in the circuit board structure 600. The first portion 632 and the second portion 634 of the stopper 630 are at right angles, and one of the conductive bumps 624 abuts against the first portion 632 of the stopper 630 in a first direction x, and the one of the conductive bumps 624 abuts against the second portion 634 of the stopper 630 in a second direction y perpendicular to the first direction x. It is noted that the circuit board structure illustrated in FIG. 13 is merely an example; in other embodiments, the stopper 630 may not be seen from the top view, or the stopper 630 may be disposed at other positions relative to the chip 622. In fact, the stopper 630 can be disposed at any location that abuts any of the conductive bumps 624 of the electronic components, preferably abuts the conductive bump 624 located at a corner of the rectangular shape of the chip 622.

Figure 14:
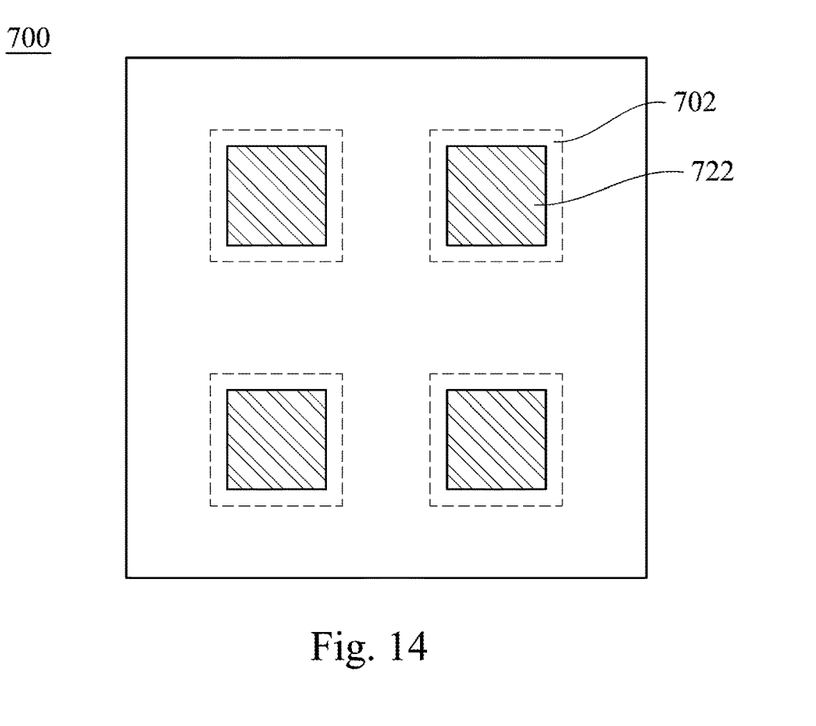
FIG. 14 is a top view illustrating a circuit board structure in accordance with embodiments of the present disclosure.

FIG. 14 is a top view of a circuit board structure 700 in accordance with some embodiments, and the figure shows that the chips 722 are accurately mounted in the chip placement areas 702 in the circuit board structure 700.

The present disclosure provides a circuit board structure for embedded electronic components and a method thereof, which improve the mounting accuracy of the electronic component by guiding the conductive bump of the electronic component to the predetermined positions of the substrate with a stopper.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circular board structure, comprising:
   a circuit layer structure comprising:
   a plurality of dielectric layers;
   circuits in the dielectric layers;
   an insulating layer over the plurality of dielectric layers; and
   a via in the insulating layer;
   an electronic component disposed in the circuit layer structure, wherein the electronic component comprises a chip and a conductive bump, the chip has a first surface and a second surface that are oppositely disposed, the first surface of the chip contacts one of the dielectric layers, the conductive bump is located on the second surface of the chip and electrically connected to the chip, the insulating layer is over the second surface of the chip, and via is electronically connected to the conductive bump;
   a stopper within the circuit layer structure, wherein the stopper is disposed over the second surface of the chip and abutting against the conductive bump; and
   an adhesive layer located between the second surface of the chip and the insulating layer, the adhesive layer adheres to the conductive bump, and a thickness of the adhesive layer is greater than a thickness of the stopper.

2. The circuit board structure of claim 1, wherein the stopper has a first portion and a second portion perpendicular to the first portion.

3. The circuit board structure of claim 1, wherein the stopper abuts against the conductive bump in a first direction and a second direction perpendicular to the first direction.

4. The circuit board structure of claim 1, wherein the conductive bump is located at a corner of a rectangular shape of the chip.

5. The circuit board structure of claim 1, wherein a thickness of the conductive bump is greater than a thickness of the stopper.

* * * * *